United States Patent [19]
Reggi

[11] 3,939,542
[45] Feb. 24, 1976

[54] METHOD FOR INSERTING CONNECTING PINS IN A PRINTED CIRCUIT AND MACHINE FOR EXECUTING SAID METHOD

[75] Inventor: Romano Reggi, Lugo, Italy

[73] Assignee: COMATEL — Comptoir Europeen de Materiel Electronique, Issy les Moulineaux, France

[22] Filed: Jan. 21, 1974

[21] Appl. No.: 435,309

[52] U.S. Cl. ......... 29/203 B; 29/203 DS; 29/203 P; 29/626; 53/3; 53/200; 227/136
[51] Int. Cl.² ...................................... H05K 13/00
[58] Field of Search ......... 29/625, 626, 630 D, 525, 29/628, 211 R, 203 B, 203 J, 203 P, 203 MW, 203 DT, 203 DS; 221/70–73, 10, 21, 200, 202; 227/136, 45, 119; 156/566, 568

[56] References Cited
UNITED STATES PATENTS

| | | | |
|---|---|---|---|
| 3,315,436 | 4/1967 | Baum et al. | 53/200 X |
| 3,605,237 | 9/1971 | Bakermans | 29/203 D |
| 3,701,233 | 10/1972 | Luckman | 53/200 X |
| 3,729,885 | 5/1973 | Mosetich et al. | 53/3 |
| 3,739,446 | 6/1973 | Long et al. | 29/203 B |
| 3,765,075 | 10/1973 | Olney et al. | 29/203 B |
| 3,774,782 | 11/1973 | Lewis | 53/236 X |
| 3,835,521 | 9/1974 | Crump et al. | 29/203 B |
| 3,837,554 | 9/1974 | Grushon | 227/136 X |
| 3,837,556 | 9/1974 | Doyle et al. | 227/136 |

Primary Examiner—Milton S. Mehr
Assistant Examiner—Joseph A. Walkowski
Attorney, Agent, or Firm—Eyre, Mann & Lucas

[57] ABSTRACT

A method and means for inserting pins into predetermined locations of a printed circuit; said means are carried along by an adhesive strip and after removal of the latter, the foremost pin drops into horizontal registry with a pusher member urging it into vertical registry with a funnel-shaped member brought over the desired location of the circuit while a pneumatic circuit operating for each pin insertion drives said foremost pin through the funnel-shaped member into said location.

8 Claims, 7 Drawing Figures

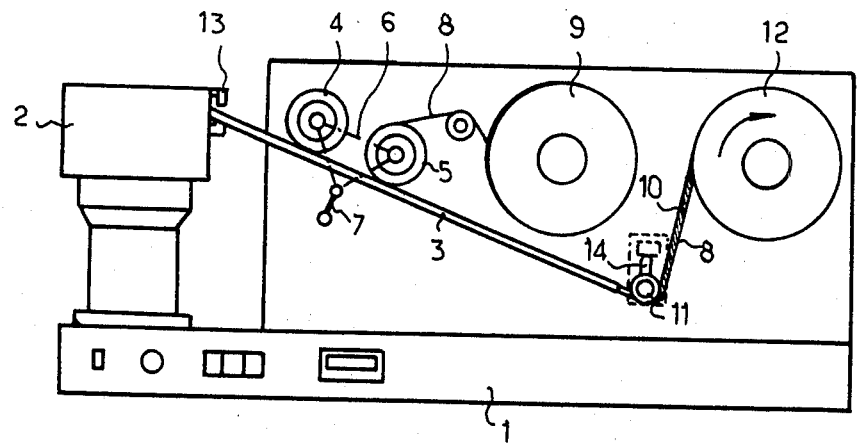
FIG. 1
FIG. 2
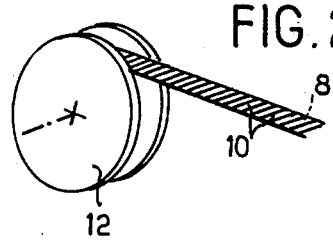
FIG. 3
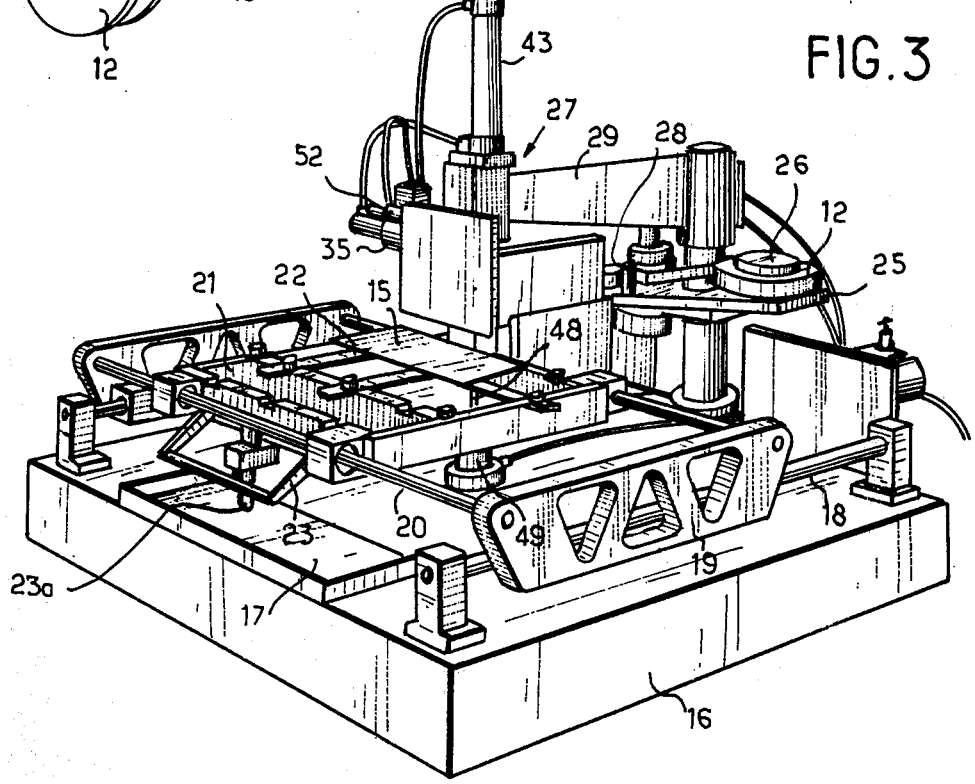

METHOD FOR INSERTING CONNECTING PINS IN A PRINTED CIRCUIT AND MACHINE FOR EXECUTING SAID METHOD

The connection of a terminal of a printed circuit with a lead is generally provided by means of a pin which is inserted through a hole in the printed circuit and round which the bare end of the lead is wound.

My invention has for its object a novel method of insertion of such pins in a printed circuit.

According to my invention, this insertion is obtained by setting a number of pins side by side on an adhesive carrier strip, which strip conveys the pins over a predetermined path and is then removed off the pins so as to allow the pins thus released to be pushed into the holes in the printed circuit which are then in registry with them.

My invention also covers an arrangement for carrying pins to be inserted in printed circuits, which pins, according to the invention are laid side by side across an adhesive conveyor strip the breadth of which is smaller than the length of the pins.

My invention covers furthermore an apparatus forming the above-mentioned pin-conveying arrangement, said machine including a guiding channel, means feeding said channel with pins, means applying an adhesive strip over the pins carried in said channel, a spool adapted to receive the succession of pins thus interconnected by the adhesive strip and means driving said spool into rotation.

My invention has lastly for its object a machine for inserting the pins into a printed circuit, said machine including a pin-inserting head provided with a channel guiding the pin-carrying strip and at a point of which the strip is removed gradually off the pins, a pusher member urging into registry with a vertically movable insertion funnel the released pin located at the lower end of the strip-guiding channel and means for urging said released pin into the insertion-funnel, for shifting said insertion funnel with the released pin into registry with the printed circuit and for urging said released pin out of the funnel into a predetermined hole in the printed circuit.

I shall now describe by way of example and in a non-limiting sense an embodiment of my invention, reference being made to the accompanying drawings wherein:

FIG. 1 is a diagrammatical elevational view of the machine adapted to interconnect a succession of pins through the agency of an adhesive strip.

FIG. 2 is a perspective view showing a pin-carrying strip wound over a spool.

FIG. 3 is a perspective view of the pin-inserting machine.

Figure 4:
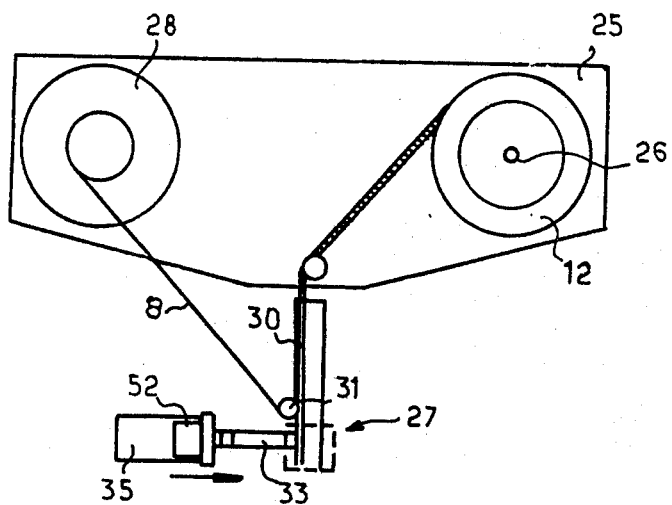
FIG. 4 is a plan view showing the pin-inserting head and the means feeding said head with pins.
Figure 5:
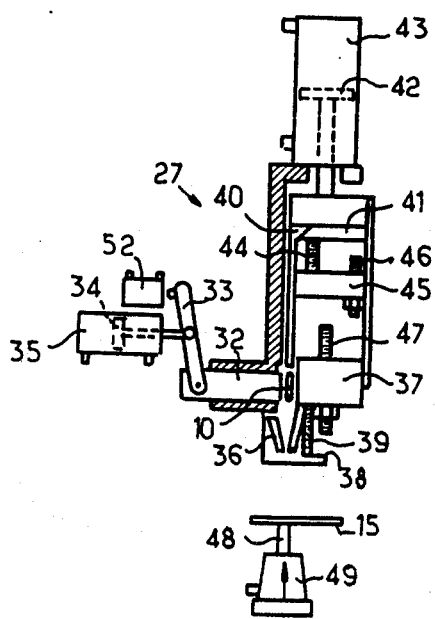
FIG. 5 is a vertical cross-section through the pin-inserting head.
Figure 6:
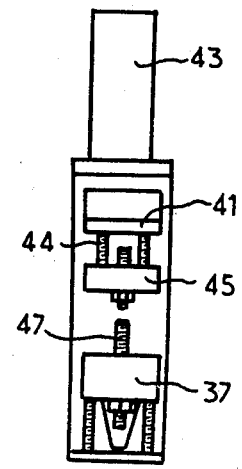
FIG. 6 is an elevational view of said head.

In FIG. 1, 1 designates a frame to which is secured a vibrating bowl 2 opening into a downwardly sloping guiding channel 3.

Two rollers 4 and 5 arranged in the vicinity of said channel and made of a comparatively yielding material such as rubber, are rotatably carried by a support 6 adapted to be shifted by a lever 7 in a direction which is substantially perpendicular to the channel 3. The roller 4 is operatively connected with the shaft of a driving motor which is not illustrated while the roller 5 forms a guiding roller for a strip 8 of adhesive material wound off a spool 9.

During operation, the pins 10 are laid inside the vibrating bowl 2 which distributes the pins one by one in succession into the channel 3, so that they may lie transversely across said channel in parallelism with one another. The roller 4 urges the pins towards the roller 5 which lays the adhesive strip 8 over them. The strip 8 now carrying the pins passes over a further guiding roller 11 and is wound again over a spool 12 driven into rotation by means which are not illustrated. The operation of the lever 7 provides means for urging the rollers 4 and 5 against the pins and for adjusting the pressure exerted by the strip in contact with the pin.

A photocell 13 located above the upper end of the channel 3 is adapted to switch off the motor driving the roller 4 whenever the feed of pins is defective or has stopped. The spindle carrying the guiding roller 11 is adapted to move along a slot 14 formed in the frame 1, against the action of return springs which are not illustrated, such a movement of the spindle controlling a miniature circuit-breaker through which the drive of the spool 12 is stopped whenever the tensioning of the strip rises above a predetermined value.

The pins 10 held together by the adhesive strip 8 (FIG. 2) form a continuous ribbon which is wound over the spool 12. Since slight differences in length may appear between the different pins, the latter may project slightly to either side of the strip 8, this being quite unimportant during the operation of the machine.

FIGS. 3 to 7 illustrate a machine designed for the insertion of the pins 10 into a plate carrying a printed circuit 15. This machine includes a frame 16 to which is adjustably secured a template or circuit model 17 while said frame carries transverse bars 18 on which is slidingly fitted a carriage 19. This carriage 19 carries in its turn longitudinal bars 20 on which is slidingly fitted a support 21 for the printed circuit plate 15 secured thereto through the agency of adjustable lugs 22. A control handle 23 carried by the support 21 is pivotally secured to one of the longitudinal bars 20, so that it provides means for shifting the support 21 over the carriage 19 and the carriage 19 over the frame 16. Said control-handle carries a conical feeler 23a adapted to be inserted in the desired hole provided in the template 17. Whenever the conical feeler has properly engaged such a hole, the handle 23 operates a miniature switch 24 (see FIG. 7).

A platform 25 rigid with the frame 26 carries a stub-shaft 26 adapted to carry the spool 12. The pin-carrying strip is fed by said spool into the pin-inserting head generally designated by the reference number 27 and in which the adhesive strip 8 is removed off the pins and wound over a spool 28 which is driven into rotation by a torque-limiting device.

The pin-inserting head 27 rests on an upright and is provided with a channel 30 (FIG. 4) the breadth of which registers with that of the pins while its input opening is substantially as broad as the strip 8. The actual adhesive strip after entering the channel 30 with the pins is torn away from the latter, and is wound alone over the spool 28 towards which it is guided by the roller 31.

A pusher member 32 slidingly carried across the lower end of the channel 30 is pivotally connected through a lever 33 with a piston 34 adapted to move within the cylinder 35. The breadth of the output opening of the channel 30 registering with the pusher member 32 is equal to the length of any pin whereby said pusher member is adapted to drive a pin 10 into registry with the pin-inserting funnel 36 while it simultaneously holds the remaining pins in the channel 30 against sinking.

Said pin-inserting funnel 36 is carried by a support 37 adapted to move vertically with reference to a stationary member 38 rigid with the frame of the pin-inserting head, against the action of the return spring 39. A punch 40 which is coaxially movable inside the funnel 36 is rigid with a vertically movable part 41. Said part 41 is rigid in its turn with a piston 42 adapted to move within a cylinder 43 and engages through the spring 44 a further vertically movable part 45. The latter is provided with an adjustable stop 46 adapted to come into contact with the part 41; furthermore the support 37 carries an adjustable stop 47 adapted to come into contact with the further vertically movable part 45.

Underneath the printed circuit 15, there is provided in axial alignment with the pin-inserting funnel 36 a piston 48 adapted to carry said printed circuit during the insertion of a pin, said piston 48 being slidingly carried inside a cylinder 49.

Figure 7:
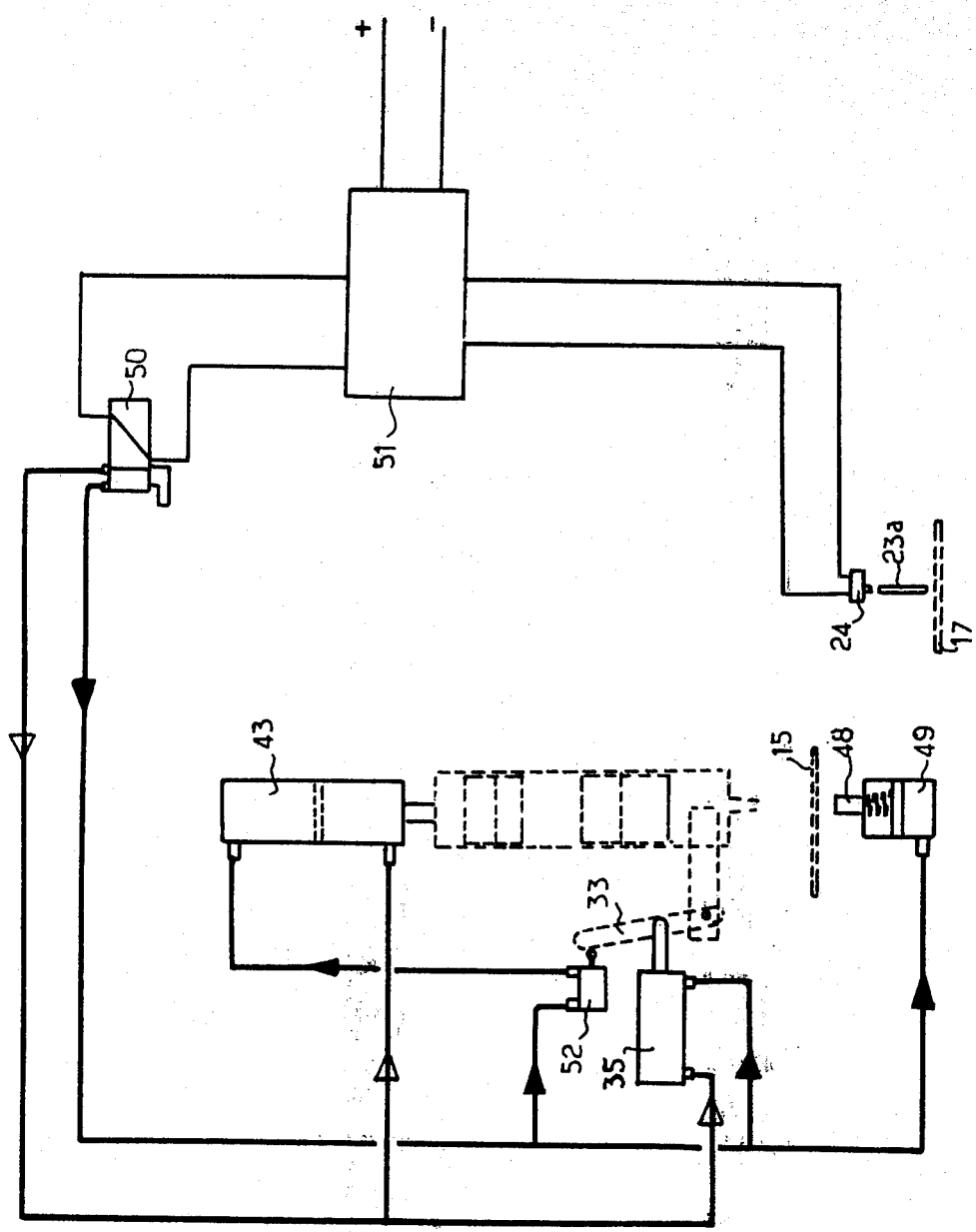
FIG. 7 is a diagram showing the pneumatic control system of the machine illustrated in FIGS. 3 to 6.

As apparent from inspection of FIG. 7, the miniature circuit-breaker 24 controls an electrovalve 50 through the agency of an electronic delaying system 51 provided with a storage. The electrovalve is operatively connected with the cylinders 43 and 49 and also with the cylinder 35 under control of the lever 33.

The operation of the pin-inserting machine is as follows: the template 17 is secured to the frame 16 in a manner such that its position with reference to the feeler 23a is defined by the position of the printed circuit 15 with reference to the pin-inserting channel 36. The feeler 23a is then brought into registry with the desired hole in the template and the handle 23 is rocked, so that the feeler enters said hole.

The miniature circuit-breaker 24 operated thus by the feeler controls the electrovalve 50 which feeds compressed air into the cylinders 35 and 49. The piston 48 in the cylinder 49 rises upwardly towards the printed circuit 15 and holds it in position. On the other hand, the piston 34 moves inside the cylinder 35 and shifts through the agency of the lever 33 the pusher member 32 which urges a pin 10 into registry with the pin-inserting funnel 36. At the end of this movement, the lever 33 actuates the valve 52, so as to make it deliver air into the cylinder 43. The piston 42 in the latter drives then the part 41 forwardly, which part 41 pushes downwardly the punch 40. The latter urges then into the pin-inserting funnel 36 the pin 10 which has been shifted out of the guiding channel 30 into registry with said pin-inserting funnel 36, while simultaneously the part 45 sinks until it meets the stop 47 on the support 37. From this moment onwards, the support 37 sinks together with the funnel 36 against the pressure of the spring 39 until said support 37 carrying the funnel 36 impinges against the stationary member 38. During this time the piston 42 continues moving downwardly and urges in the same direction the part 41 against the pressure of the spring 44 and consequently the punch 40 drives the pin 10 through the funnel 36 into the desired location on the printed circuit 15. The piston 42 stops on its downward path when the part 41 meets the stop 46, which provides thus an adjustment of the depth of drive of the pin.

Thenafter, the electrovalve is returned into its original condition so that the different pistons also return into their starting positions and the machine is ready for the execution of a further operative cycle.

Obviously, the invention is by no means limited to the embodiment described and illustrated and in contradistinction, it covers all the modifications thereof falling within the scope of the accompanying claims.

What I claim is:

1. A machine for inserting connecting pins into predetermined locations of a printed circuit, comprising a first conveying channel for conveying a plurality of pins, means for feeding succession of pins into said channel each said pin being parallel to each adjacent pin and being aligned transversely to the conveying direction of the conveying channel, a spool carrying an adhesive strip, means for leading said strip off the spool along a path adjacent the pins in the conveying channel means for bringing the said strip into adhesive contact with the pins whereby the pins become adhered to said strip and form a pin-carrying strip, a take-up spool for the pin-carrying strip, means for feeding the pin-carrying strip over a pre-determined path towards the printed circuit and stripping the pins near the end of said path off the strip to allow them to be inserted in succession into the desired locations of the circuit, and means for inserting the pins in the desired locations.

2. The machine as claimed in claim 1 further comprising a roller engaging the surface of the pins in the first part of said channel to urge said pins forwardly in said channel in juxtaposed relationship.

3. A machine as claimed in claim 1 wherein said last-mentioned feeding means comprise a second guiding channel adapted to convey the pin-carrying strip passing off the take-up spool, and means for separating the strip from the succession of pins at the output of said second guiding channel and wherein said inserting means comprise a pin-inverting funnel adapted for vertical displacement and located adjacent the output of said second guiding channel during the outputing therefrom of a pin to be inserted, a pusher member intermediate the output of said funnel adapted to displace a pin to be inserted from the former to the latter said displacement defining movement into registry with the latter and means adapted to urge the displaced pin from its point of registry with said funnel, therethrough and to a point just above the desired location of the printed circuit and to drive the pin out of said funnel into said location.

4. A machine as claimed in claim 1 comprising a frame, a support adapted to carry the printed circuit, a template carried by said frame and provided with a pattern of holes, means for adjusting the position of said support over said frame with reference to said template and a feeler adapted to move in unison with said support and to be urged downwardly into a predetermined hole of said template.

5. A machine as claimed in claim 1 comprising a vertically movable pin-inserting funnel adapted to receive the successive pins stripped off said strip, a support lying underneath the lower output end of said funnel and adapted to carry a printed circuit and means for raising said support towards said output end of the pin-inserting funnel whereby the insertion of pins is initiated.

6. A machine as claimed in claim 1 wherein said pin-inserting means comprise a vertically movable pin-inserting funnel adapted to be set over a pre-determined hole of the printed circuit, a control piston adapted to be vertically displaced, a first member operatively associated with said control piston and moving in unison therewith, a punch rigid with said first member and adapted to urge a pin downwardly, a second member operatively associated with said control piston and said first member lying beneath said first member, first elastic stop means intermediate said first and second members, said first stop means serving to at least partially define the cooperative association of said first and second members, a support to which said funnel is rigidly secured and located beneath said second member, and second elastic stop means intermediate said second member and said support, said second stop means serving to at least partially define a cooperative association among the various cooperatively associated means and members of said pin inserting means hereinabove recited, all associations being effective upon a downward displacement of said piston which displacement urges first said punch downwardly upon which said first member and said second member are likewise urged downwardly whereupon and whereby a pin in registry with said funnel is inserted in said predetermined hole.

7. A machine as claimed in claim 6 and further comprising an auxiliary piston adapted to operate at the beginning of the pin-inserting cycle; a valve controlled by said piston and a pneumatic circuit controlled by said valve and controlling said control piston.

8. A machine as claimed in claim 1 wherein said feeding means comprise a guiding channel for said pin-carrying strip passing off said take-up spool, the breadth of said guiding channel being substantially equal to the length of the pins and having an input substantially equal to the breadth of the adhesive strip, means at the output of said guiding channel for stripping the pins off of the adhesive strip, a pin-inserting funnel at the output of said guiding channel adapted to be vertically displaced, means for pushing a pin from the output of said guiding channel into said pin-inserting funnel and means adapted to urge the pin pushed through said funnel to a point above that where the pin is to be inserted into the circuit, said machine further comprising means adapted to drive the pin out of the funnel into the desired location of the printed circuit, a frame, a support forming a portion of said frame and adapted to receive the printed circuit, a template situated on a portion of said frame and having a pattern of holes therein, means for adjusting the position of said support over the portion of said frame adapted to receive said template, a feeler adapted to move in unison with the circuit and to be urged downwardly into a predetermined hole of the template, a miniature switch controlled by said feeler, a valve controlled by said switch and a pneumatic circuit controlled by said valve and in turn controlling the actuation of said pusher means and said means for driving the pin out of said funnel.

* * * * *

UNITED STATES PATENT OFFICE
CERTIFICATE OF CORRECTION

PATENT NO. : 3,939,542
DATED : February 24, 1976
INVENTOR(S) : Romano Reggi

It is certified that error appears in the above-identified patent and that said Letters Patent are hereby corrected as shown below:

Foreign Application Priority Data

April 11, 1973 France......................73.13613

$\mathfrak{S}$igned and $\mathfrak{S}$ealed this eleventh Day of May 1976

[SEAL]

Attest:

RUTH C. MASON
*Attesting Officer*

C. MARSHALL DANN
*Commissioner of Patents and Trademarks*